United States Patent [19]
Sugawara et al.

[11] Patent Number: 5,822,085
[45] Date of Patent: Oct. 13, 1998

[54] DATA COMMUNICATION SYSTEM FOR WRITING OR READING DATA TO/FROM IMAGE FORMING APPARATUS AT A REMOTE DISTANCE AND DATA COMMUNICATING APPARATUS CONSTRUCTING SUCH A SYSTEM

[75] Inventors: Kazuhiro Sugawara, Tokyo; Seishi Ejiri, Kawasaki; Toru Fujino, Urawa; Akemi Nishimaki, Yokohama, all of Japan

[73] Assignee: Canon Kabushiki Kaisha, Tokyo, Japan

[21] Appl. No.: 906,155

[22] Filed: Aug. 5, 1997

Related U.S. Application Data

[63] Continuation of Ser. No. 493,248, Jun. 22, 1995, abandoned.

[30] Foreign Application Priority Data

Jul. 11, 1994 [JP] Japan .................................. 6-158499

[51] Int. Cl.$^6$ .............................. H04N 1/40; G11C 7/00
[52] U.S. Cl. ...................... 358/444; 358/404; 358/431; 365/195; 711/163; 395/114
[58] Field of Search ..................... 358/444, 442, 358/404, 468, 431, 434, 453; 365/189.01, 189.08, 195–196; 711/152, 155, 163; 395/101, 112, 113, 114, 115, 116

[56] References Cited

U.S. PATENT DOCUMENTS

| | | | |
|---|---|---|---|
| 4,864,542 | 9/1989 | Oshima et al. | 365/189.01 |
| 5,048,078 | 9/1991 | Satomi et al. | 379/100 |
| 5,097,445 | 3/1992 | Yamauchi | 365/195 |
| 5,130,946 | 7/1992 | Watanabe | 365/189.01 |
| 5,467,081 | 11/1995 | Drews et al. | 340/825.34 |
| 5,500,742 | 3/1996 | Kamijo | 358/448 |
| 5,633,992 | 5/1997 | Gyllenskog | 395/114 |
| 5,644,405 | 7/1997 | Sato | 358/404 |

FOREIGN PATENT DOCUMENTS

56-126352 10/1981 Japan .
6267191 9/1994 Japan .

*Primary Examiner*—Edward L. Coles
*Assistant Examiner*—Madeleine AV. Nguyen
*Attorney, Agent, or Firm*—Fitzpatrick, Cella, Harper & Scinto

[57] ABSTRACT

In a remote registry system, an object of the invention is to read and write memory data as binary data. A memory access method is limited for a data read inhibit area or a write inhibit area. A facsimile apparatus of a remote registry system comprises an RMD communication unit, an RMD command analysis unit, a transmission and reception unit of memory data, a memory of binary data, a judging unit for judging whether an area is the read inhibit area in a memory area or not, and a judging unit for judging whether the area is the write inhibit area in the memory area or not.

18 Claims, 13 Drawing Sheets

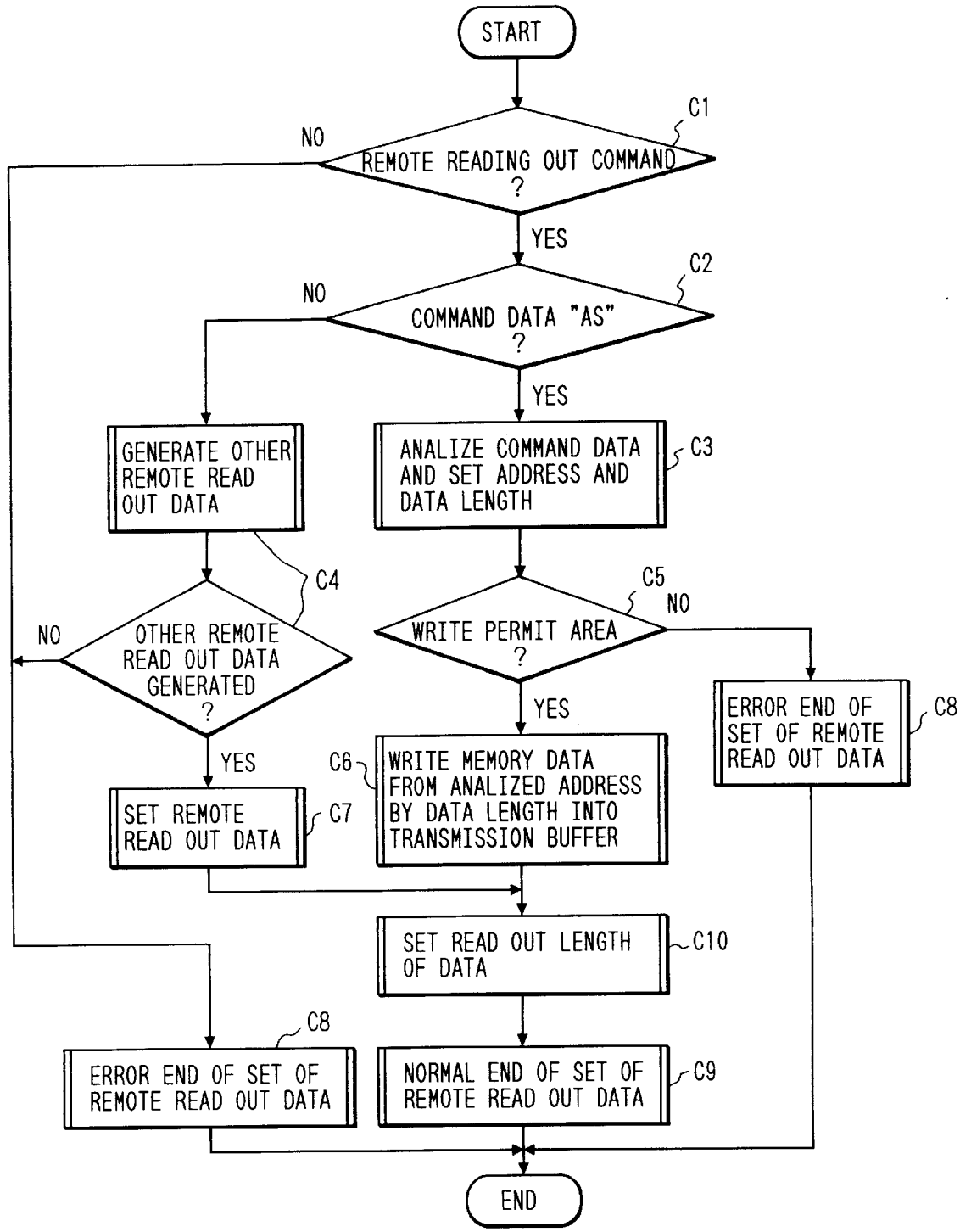

FIG. 8A

TRANSMISSION DATA BUFFER

```
AL020000, 00200, ····· BINARY DATA ······
                  ·····
                  ·····  C L F
                  ·····  R F F  Q
```

AL COMMAND (BINARY MEMORY DATA REGISTRY COMMAND (WRITING))
EXAMPLE OF DATA TYPE: (START ADDRESS 20000H, WHEN DATA LENGTH 200H BYTE)

| AL020000 , 00200 , DATA STRING ····· $^{C\ L\ F}_{R\ F\ F}$ Q | ASCII |
| 414C303230303030 ,2C, 3030323030 ,2C, 00FF00FF ···· 00FF00FF0D0A0C04 | HEX |

|←——————— ASCII CHARACTER STRING ———————→|←——— ONLY BINARY DATA ———→|

FIG. 8B

RECEPTION DATA BUFFER

```
AS020000, 00200  C L F  Q
                 R F F
```

AS COMMAND (BINARY MEMORY DATA TRANSFER DEMAND COMMAND (READING OUT))
EXAMPLE OF DATA TYPE: (START ADDRESS 20000H, WHEN DATA LENGTH 200H BYTE)

| AS020000 , 00200 , $^{C\ L\ F}_{R\ F\ F}$ Q | ASCII |
| 4153303230303030 ,2C, 3030323030 ,2C, 0D0A0C04 | HEX |

|←——————— ASCII CHARACTER STRING ———————→|← END CHARACTER →|

FIG. 10

CORRESPONDENCE BETWEEN MEMORY ADDRESS MAP
AND MEMORY ACCESS CONDITION BY RMD

| MEMORY ADDRESS MAP | MEMORY ACCESS CONDITION BY RMD |
|---|---|
| VECTOR TABLE | MEMORY WRITE INHIBIT AREA |
| ROM AREA | |
| RAM AREA | |
| OS WORK AREA | MEMORY WRITE INHIBIT AREA |
| CONFIDENTIAL DATA | MEMORY READ INHIBIT AREA |
| REGISTRY SW<br>RMD RECEPTION, TRANSMISSION<br>DATA BUFFER | |
| ROM AREA | MEMORY WRITE INHIBIT AREA |
| RAM AREA<br><br>IMAGE FILE | |
| OUT OF MEMORY ADDRESS RANGE | MEMORY READ INHIBIT AREA |

DATA COMMUNICATION SYSTEM FOR WRITING OR READING DATA TO/FROM IMAGE FORMING APPARATUS AT A REMOTE DISTANCE AND DATA COMMUNICATING APPARATUS CONSTRUCTING SUCH A SYSTEM

This application is a continuation of Ser. No. 08/493,248 filed Jun. 22, 1995 abandoned.

BACKGROUND OF THE INVENTION

1. Field of the Invention

The present invention relates to a data communication system for writing or reading data to/from an image forming apparatus at a remote distance and a data communicating apparatus which constructs such a system.

2. Related Background Art

Recently, a system such that when an old facsimile apparatus is exchanged to a new facsimile apparatus, data such as abbreviated dial numbers and the like registered in the old facsimile apparatus is transferred to a service center through a telephone line and, after the new facsimile apparatus was installed, the data which has already been transferred to the service center is transferred to the new facsimile apparatus through the telephone line has been proposed. With such a system, a troublesomeness for the data registration can be omitted.

When such a system is realized, however, there is a fear such that data which the operator of the facsimile apparatus doesn't want someone to see is transferred or data which is not wanted to be rewritten is rewritten. There is a case where a disadvantage is given to the operator.

SUMMARY OF THE INVENTION

It is an object of the invention to provide a data communication system and a data communicating apparatus which can solve the above-mentioned problems.

Another object of the invention is to provide a data communication system and a data communicating apparatus in which data in a predetermined area in a memory of an image forming apparatus is not read out from the outside.

Further another object of the invention is to provide a data communication system and a data communicating apparatus in which data is not written from the outside to a predetermined area in a memory of an image forming apparatus.

The above and other objects and features of the present invention will become apparent from the following detailed description and the appended claims with reference to the accompanying drawings.

BRIEF DESCRIPTION OF THE DRAWINGS

FIG. 7 is a flowchart 1 of a formation of reading-out data of memory data (embodiment 1);

FIGS. 8A and 8B are diagrams showing storage file formats of a transmission buffer and a reception buffer;

FIG. 10 is a diagram showing a correspondence table between a memory address map and a memory access condition by an RMD;

DETAILED DESCRIPTION OF THE PREFERRED EMBODIMENTS (First embodiment)

Figure 1:
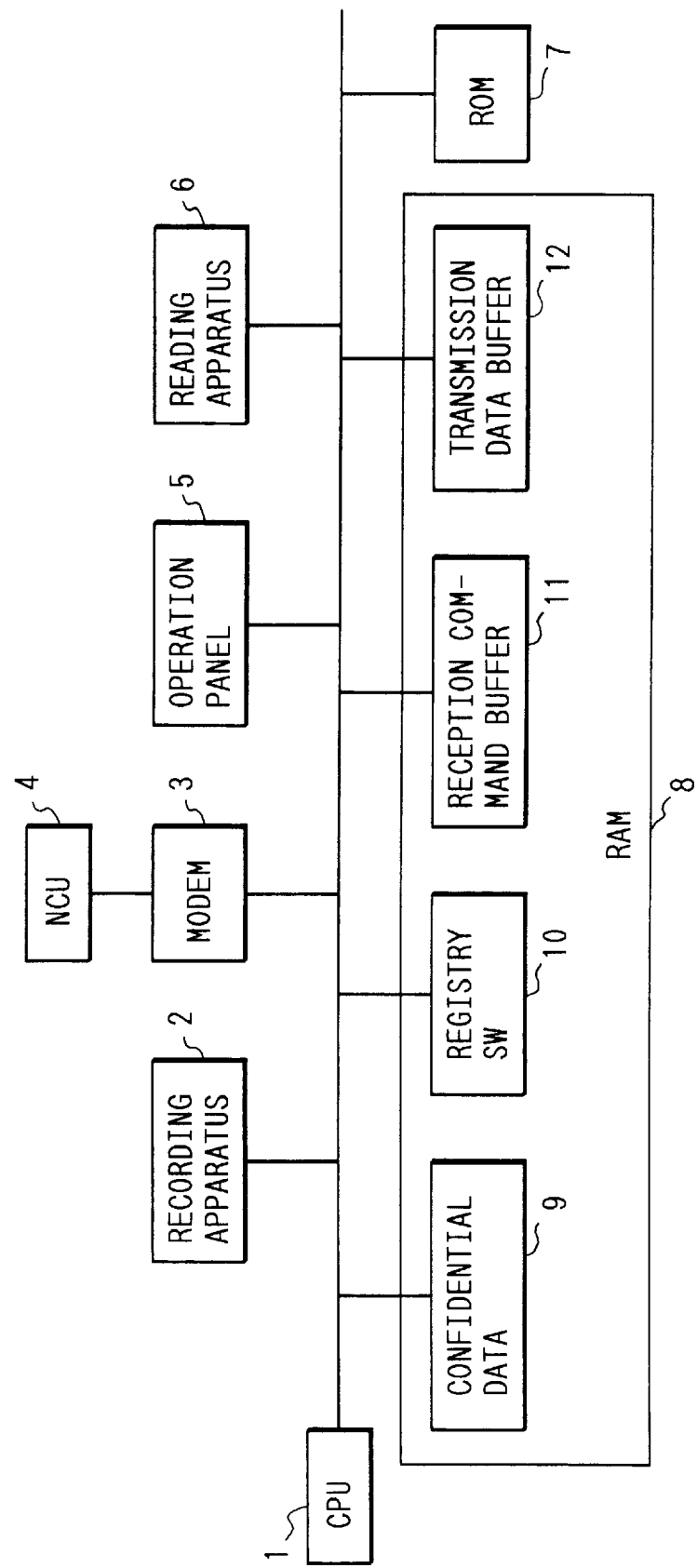
FIG. 1 is a constructional diagram of a facsimile apparatus of an embodiment of the invention.

A facsimile apparatus of an embodiment of the invention is as shown in FIG. 1. In the diagram, reference numeral 1 denotes a CPU for controlling a system of the facsimile apparatus; 2 a recording unit for recording a received image onto a sheet; 3 a modem for modulating and demodulating image data of the facsimile apparatus at the time of a transmission and a reception; 4 an NCU for connecting to a public line and generating a call; 5 an operation panel for operating various operation keys of the facsimile apparatus and displaying by an LCD or an LED; 6 a reading apparatus for reading out an image of an original and storing it in an RAM 8; 7 an ROM in which a control program of the facsimile apparatus, message data and the like have been assembled; and 8 the readable and writable memory (RAM). The RAM 8 has a buffer 11 (first memory means) for reception data of a remote registry system; a buffer 12 (second memory means) for transmission data; confidential data 9 such as password of the user, communication management data, and the like; and a switch 10 for allowing a memory to be written. A construction of the facsimile apparatus shown in FIG. 1 corresponds to that of each of facsimile apparatuses 101, 102, and 103 in FIG. 2.

Figure 2:
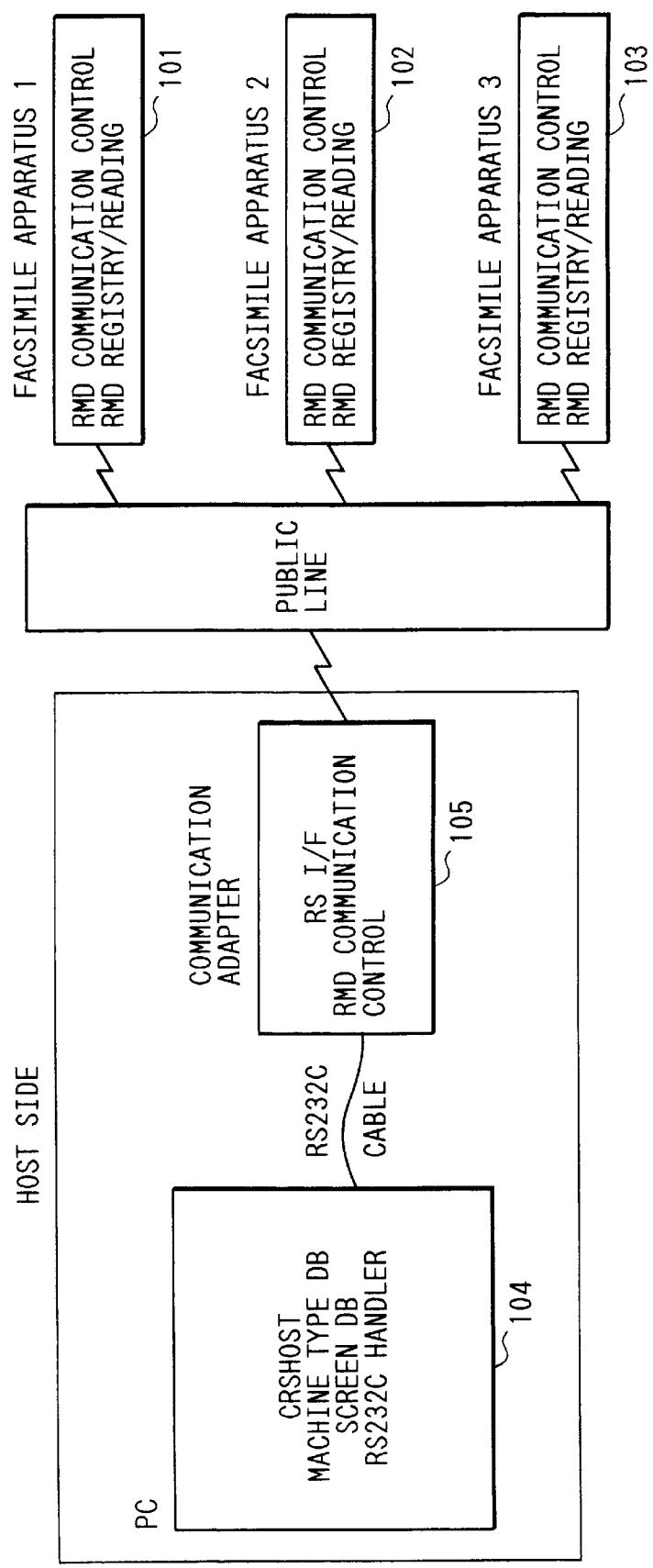
FIG. 2 is a constructional diagram of a remote registry system.

In the remote registry system of the embodiment of the invention, as shown in FIG. 2, the host side is constructed by a personal computer (PC) 104 and a communication adapter 105 and the facsimile apparatuses 101 to 103 are installed through a public line. A facsimile apparatus having an RS I/F and an RMD communication control can be also used as a communication adapter 105.

The PC 104 has a main body program (CRSHOST), a machine type data base (machine type DB), a screen data base (screen DB), and an RS232C handler. In a state such that the RS232C handler always exists, the system of the PC 104 is activated by executing the CRSHOST.

The communication adapter 105 has an interface of the RS232C and a control program of a remote registry/reading-out (RMD: remote diagnostics) communication.

The facsimile apparatuses 101 to 103 execute an RMD communication control and can perform a registry of data received from the host side and a transmission of data read out from a self memory to the host side.

Figure 3:
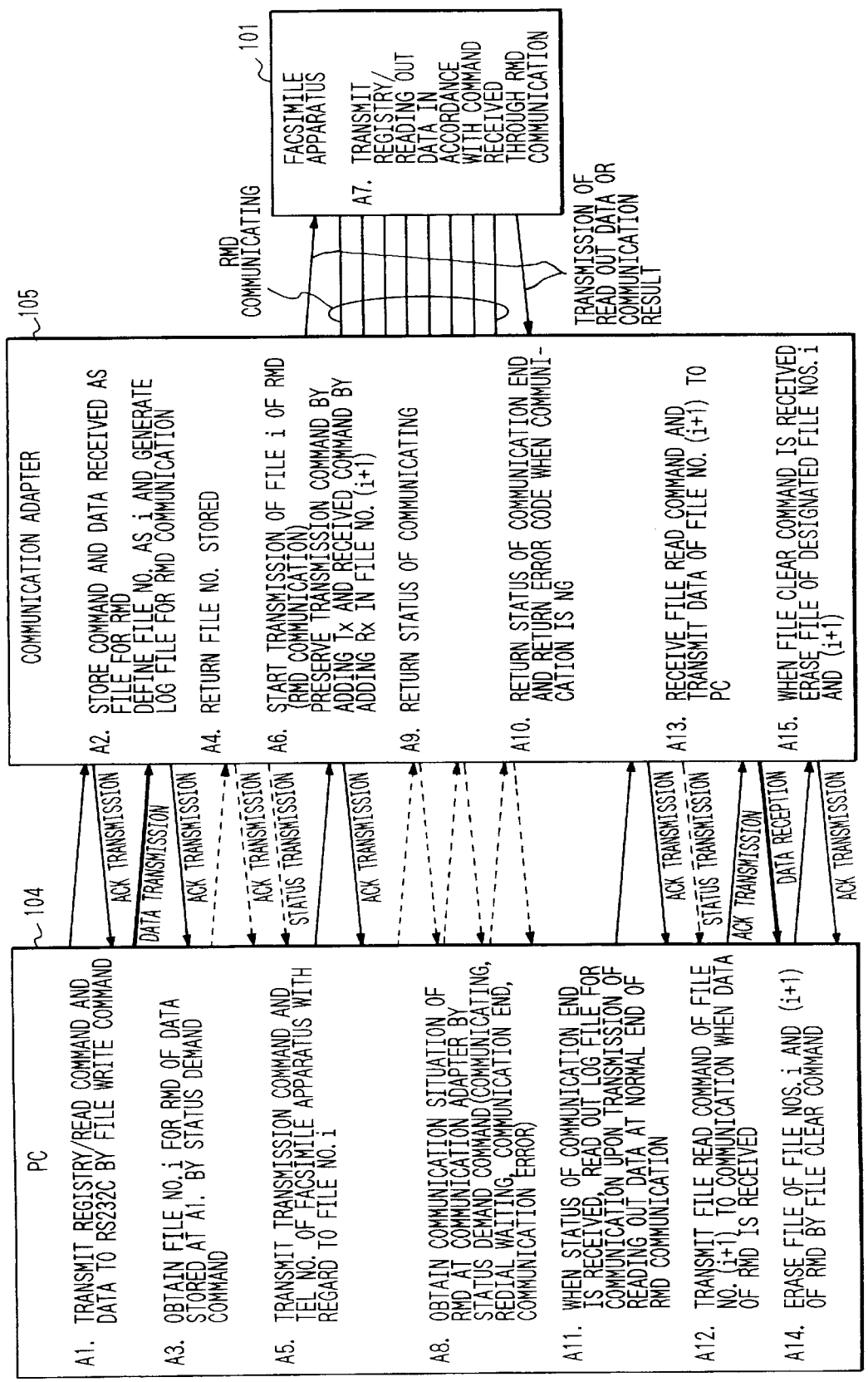
FIG. 3 shows a data flow of a remote registry system.

A data flow regarding the registry/read data of the remote registry system is as shown in FIG. 3.

A1. A registry/read command, registry data, and the like are transmitted by a file write command by the PC 104 to the RS232C. When ACK is received after transmitting the command, the registry/read command and registry data are transmitted to the RS232C.

A2. The communication adapter 105 stores the received registry/read data as a file for the RMD into an image memory. The file No. in this instance is defined as (i) and a log file of the RMD communication is generated as a file No. (i+1). After the reception of the registry/read data, ACK is transmitted.

A3. The PC 104 transmits a status request command to obtain a storage file No. of the data stored in A2.

A4. When the status request command is received, the communication adapter transmits the file No. i in which the registry/read data has been stored in A2 as status data to the PC 104.

A5. In order to transmit the file No. i to the facsimile apparatus 101, a transmission command and a telephone number of the facsimile apparatus 101 are transmitted to the communication adapter 105.

A6. When the transmission command is received, the communication adapter 105 generates a call to the facsimile apparatus 101 and the designated file No. is transmitted. Since the transmission file is a file for the RMD, the communication operates as an RMD communication. The transmission data during the communication is added with Tx and the reception data is added with Rx and the data is preserved in the file No. (i+1).

A7. A facsimile terminal starts the RMD communication with the communication adapter and operates in a registry procedure (data registry/request phase) or a transmission procedure of the reading-out data (data reading-out phase) in accordance with the received command. As a response to the communication adapter 105, a registry result is transmitted in the data registry/request phase and the reading-out data is transmitted in the data reading-out phase.

A8. In order to check whether the communication has been finished during the RMD communication or not, the PC 104 transmits the status demand command and periodically confirms situations such as communicating, redial waiting, communication end, communication error, and the like. When a status of the communication end or the communication error is received, the processing routine advances to the next operation.

A9. When the status demand command is received from the PC 104, the communication adapter 105 returns a status of RMD communicating.

A10. When the RMD communication is "OK", the communication adapter 105 returns a status of the communication end for the status demand from the PC 104. (When the communication is not good (NG), a status of redial, a status of communication error, or the like is returned.)

A11. When the communication end status is received and the RMD communication is normally finished, the PC 104 advances to A14 when the registry data is sent. The PC 104 advances to A12 when the read command is sent.

When the RMD communication is finished abnormally, the communicating process is finished as a failure.

A12. Since the reading-out data has been stored in the file No. (i+1) of the communication adapter 105 when the reading-out command is transmitted, the PC 104 transmits a file read command of the file No. (i+1). When ACK and the status are received from the communication adapter 105, ACK is transmitted and the data is received.

A13. When the file read command is received, the communication adapter 105 returns ACK and the status of the file. When ACK is received, the communication adapter 105 transmits the data of the file to the PC 104.

A14. The PC 104 finally transmits a file clear command in order to erase the RMD files (Nos. i and i+1) stored in the communication adapter. When ACK is received, the PC 104 finishes the RMD communication.

A15. When the file clear command is received, the communication adapter 105 erases the files of the designated file Nos. i and (i+1). When the files are erased, ACK is returned.

Figure 4:
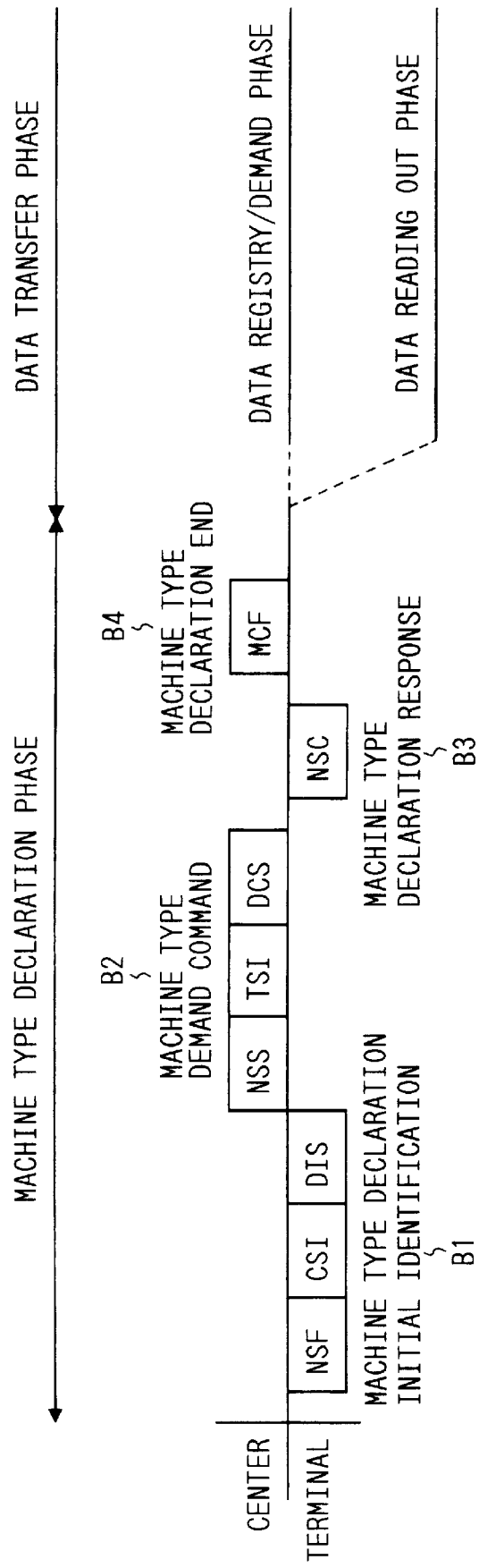
FIG. 4 is a diagram showing a transition of a machine type declaration phase command protocol.

FIG. 4 shows a machine type declaration phase in the RMD communication procedure. The RMD communication is constructed by the machine type declaration phase, a data registry/demand phase, and a data reading-out phase.

The machine type declaration phase is a phase for allowing the communication adapter 105 to check whether the facsimile apparatus 101 is of the machine type which can execute the control of the RMD communication or not and for allowing a machine type name, a destination, an ROM version of the facsimile apparatus 101 to be stored.

B1. Signals NSF, CSI, DIS of machine type declaration initial identification are transmitted from a terminal (facsimile apparatus 101).

In the initial identification, the presence/absence of the RMD communication/registry function on the terminal side is declared.

In the case where the RMD communication/registry function exists in the terminal, step B2 follows.

B2. Machine type demand commands NSS, TSI, and DCS are transmitted from a center (communication adapter 105). In the machine demand command NSS, a machine type demand command ("XD") is added to FIF (facsimile information field).

B3. When NSS is received, the terminal sets data such as a machine type name (XO), a destination (XC), and an ROM version name (XV) to the FIF (facsimile information field) of a machine type declaration response NSC by commands and transmits.

B4. When NSC is received, the center transmits a machine type declaration end MCF at the end of the machine type declaration phase.

Figure 5:
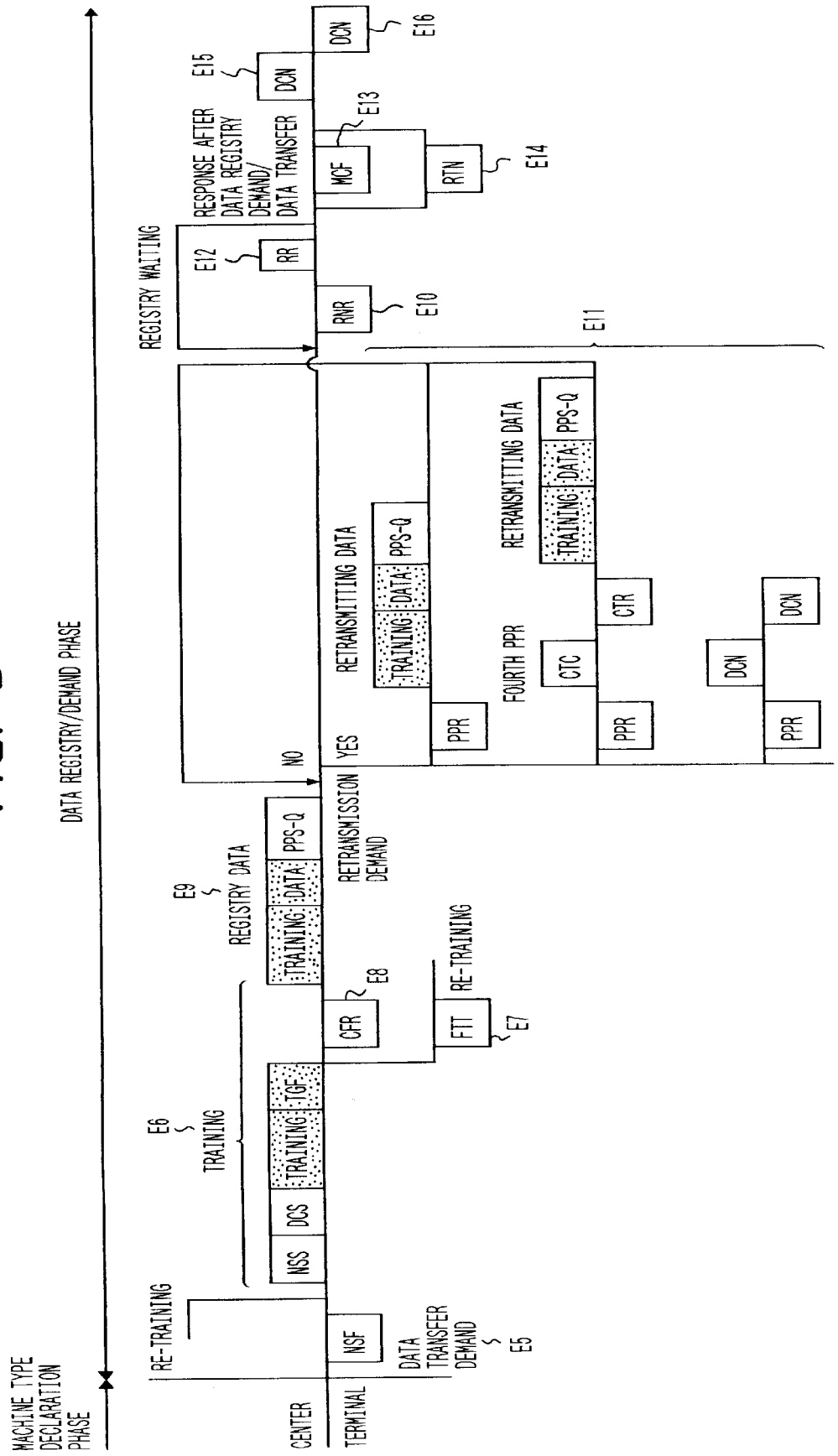
FIG. 5 is a diagram showing a transition of a data registry/demand phase command protocol.

Subsequently, when remote registry data is a data registry command, the processing routine advances to the data registry/demand phase (FIG. 5). When the remote registry data is the data read-out command, the processing routine advances to the data reading-out phase (FIG. 6).

Figure 6:
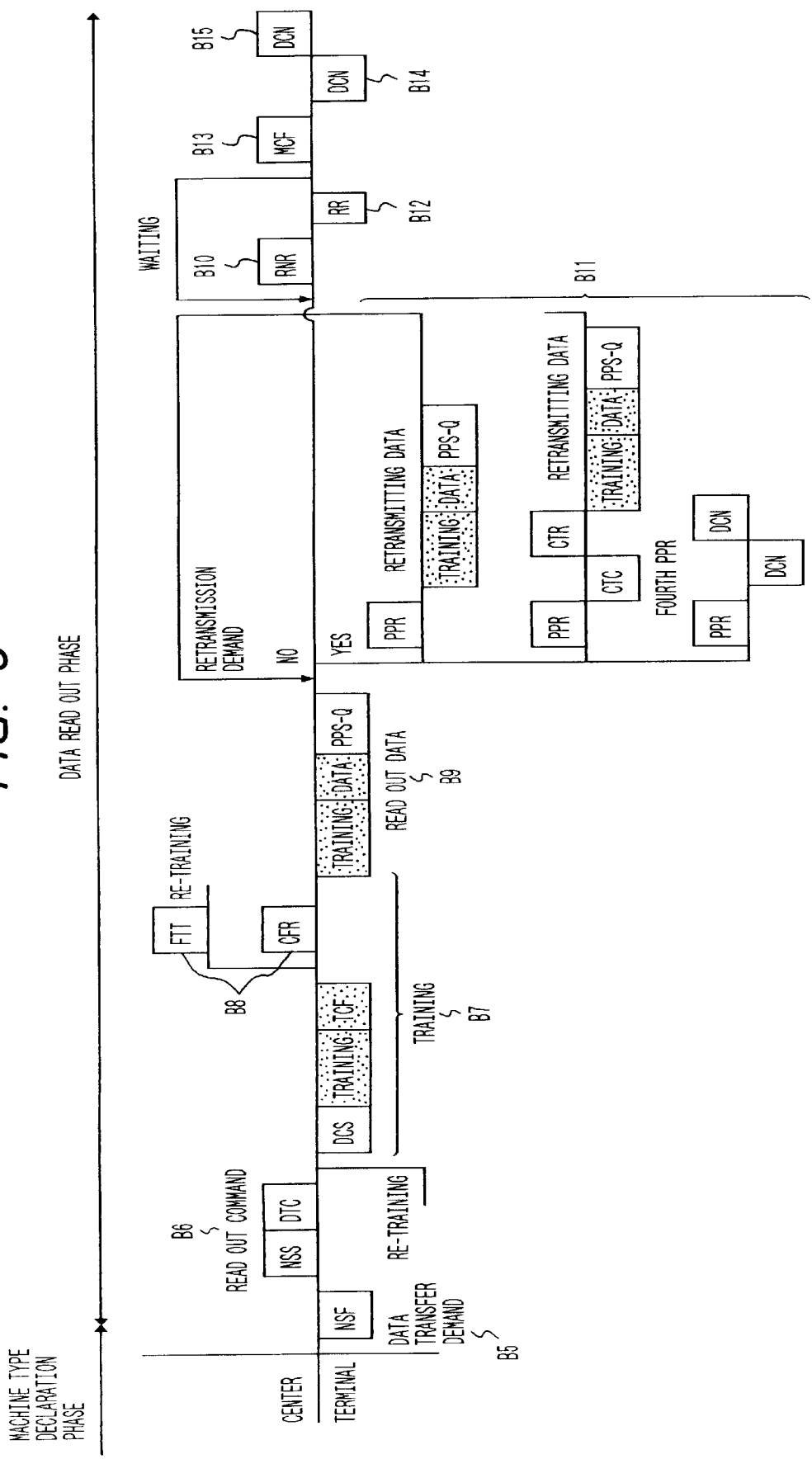
FIG. 6 is a diagram showing a transition of a data reading-out phase command protocol.

FIG. 6 shows the data reading-out phase in the RMD communication procedure.

B5. The terminal transmits the data transfer demand command NSF.

B6. When the data of the transmission file is the read-out command, the center transmits the NSS in which the read-out command is written in the FIF and DTC and starts the data reading operation.

B7. The terminal stores the read-out command of the received NSS into the first storing means and transmits training data of DCS, TRAINING, and TCF.

B8. When the training is "OK", the center sends CFR and shifts to the reception of the read data. When the training is "NG", FTT is transmitted and the processing routine is returned to a re-training.

B9. When CFR is received, the terminal transmits the read data by TRAINING, DATA, and PPS-Q. The read data is formed in this instance and a data length and the number of frames are calculated.

B10. When the frame of the received data is accurately received, the center transmits RNR and advances to a flow control of a registry waiting.

B11. When there is an error in the frame of the data received by the center, PPR is sent and a re-transmission of the error frame is requested. When the number of transmission times of PPR is less than four times, re-transmitting data TRAINING, DATA, and PPS-Q are transmitted with respect to the error frame. When the number of transmission times of PPR is equal to four, CTC is transmitted. When CTR is received, the communication speed is reduced and the re-transmission data is transmitted. When the communication speed is reduced to the lowest speed of 300 bps and the transmission of PPR is the fourth time, DCN is sent from the center and the communication is finished.

B12. When RNR is received, the terminal sends RR and waits for the end of the data transfer to the data file.

B13. When the data transfer to the read data file is completed, the center sends MCF by a response after the data was read out.

B14. When the response MCF is received after the data registry, the terminal transmits DCN and finishes the RMD communication.

B15. When DCN is received, the center sends DCN and finishes the RMD communication in a manner similar to step B14.

The procedure of the RMD communication in the invention has been described above.

In the facsimile apparatus 101, the memory data is read out by the reading-out procedure of the RMD communication.

In step B7 in the RMD communication procedure, the read-out command added in FIF (facsimile information field) of NSS is stored in the buffer for reception data. When binary memory data is read out, as shown in FIG. 8B, an AS command and a start address and a data length of the memory to be read out are stored in the buffer for reception data as an ASCII character string.

The AS command is a command for demanding the transfer of the memory data as binary data from the facsimile apparatus 101 through the communication adapter 105 and receiving the memory data by the PC 104. A data type is constructed by the AS command, start address, data length, end characters of a command, and end characters of a data file. The start address and the data length are divided by ',' (comma: 2 Ch). The end characters of the command are set to CR (0DH) and LF (0AH). The end characters of the data file of the RMD communication are set to FF (0CH) and Q (04H).

The read data (memory data) is generated by the (reading) process in step B9 in the RMD communication procedure in accordance with a flowchart of FIG. 7. The flowchart of FIG. 7 will be described hereinbelow.

C1. A check is made to see if the command is a remote read-out command or not. If YES, the processing routine advances to step C2. If NO, step C8 follows.

C2. A check is made to see if the command is the AS command or not. If YES, step C3 follows. If NO, step C4 follows.

C3. Data of the AS command is analyzed by analyzing means, the start address and the data length are set, and step C5 follows.

C4. Another remote reading-out process is executed. When the generation of the read data is "OK", step C7 follows. When the generation of the read data is "NG", step C8 follows.

C5. A check is made to see if the area is an area from which data can be read out, namely, an address which can be read out or not on the basis of the designated address. When it is the read permit area, step C6 follows. When it is not the read permit area, step C8 follows.

C6. The memory data (binary data) of an amount by the data length from the start address obtained by the process in step C3 is stored in the transmission buffer.

Figure 9:
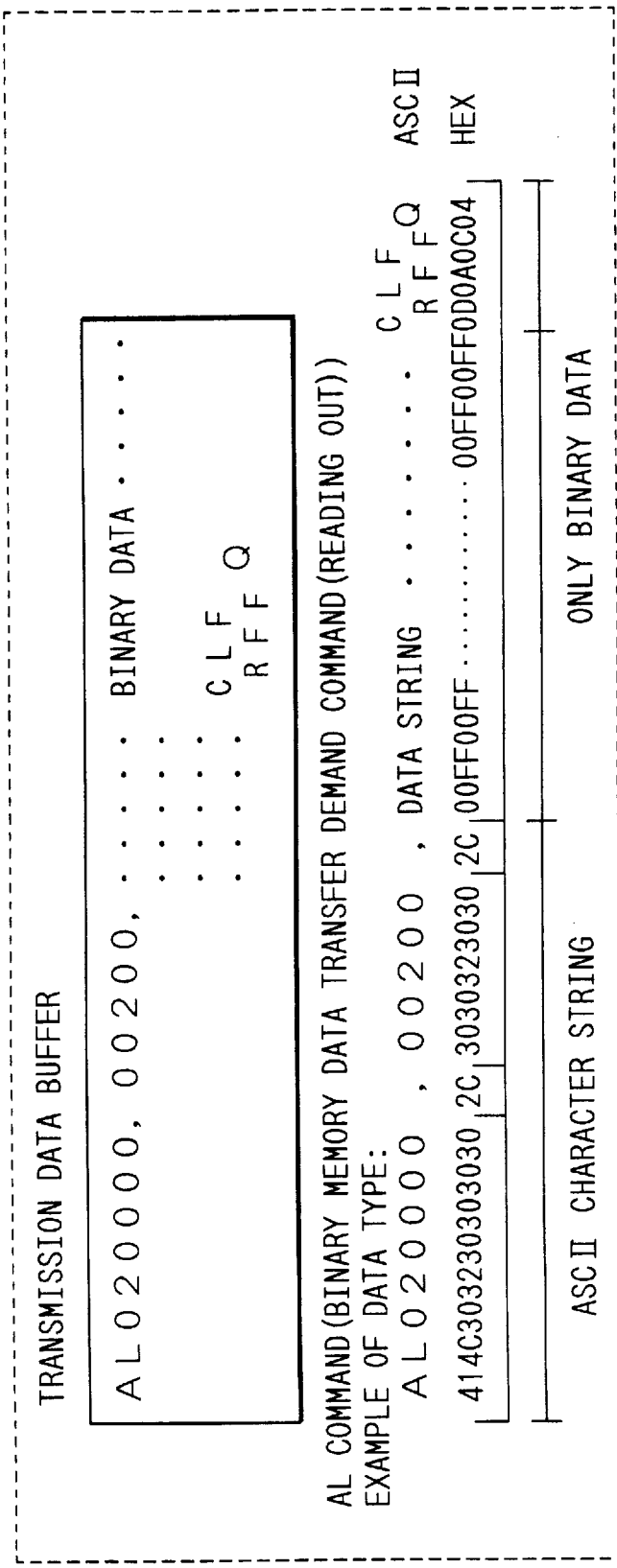
FIG. 9 is a diagram showing the storage file format of the transmission buffer.

As shown in FIG. 9, in the transmission buffer, the read data is stored in a format such that an AL command, the start address, and the data length are set as an ASCII character string and, after that, the memory data is written in a binary format and the end characters CR, LF, FF, and Q are finally added.

C7. With respect to the remote read data, the read data length is set, the number of transmission frames is counted, and the processing routine advances to step C10.

C8. An error is notified to the host side as a generation error of the remote read data and the processing routine is finished.

C9. A status indicative of a normal end of the data set of the remote read data is returned to a task of the RMD communication control and the processing routine is finished.

The procedure when the data is read out has been mentioned above. The embodiment is characterized by having the analyzing means for judging whether the area is an area from which data cannot be read out when the data is the confidential data (for example, communication management data or abbreviated dial data) or not or whether the address area is the address area out of the memory address range or not in the check of the read area in the procedure in step C5 by the memory address map in FIG. 10.

The communication management data is data in which partner's telephone numbers at the time of the transmission or reception, abbreviations of the partners' names, communication time, etc. have been stored and customer information of the facsimile user, so that it is used as confidential data. An address or data contents to inhibit the reading operation can be set by the operation panel 5 of the facsimile apparatus 101.

(Second embodiment)

Figure 11:
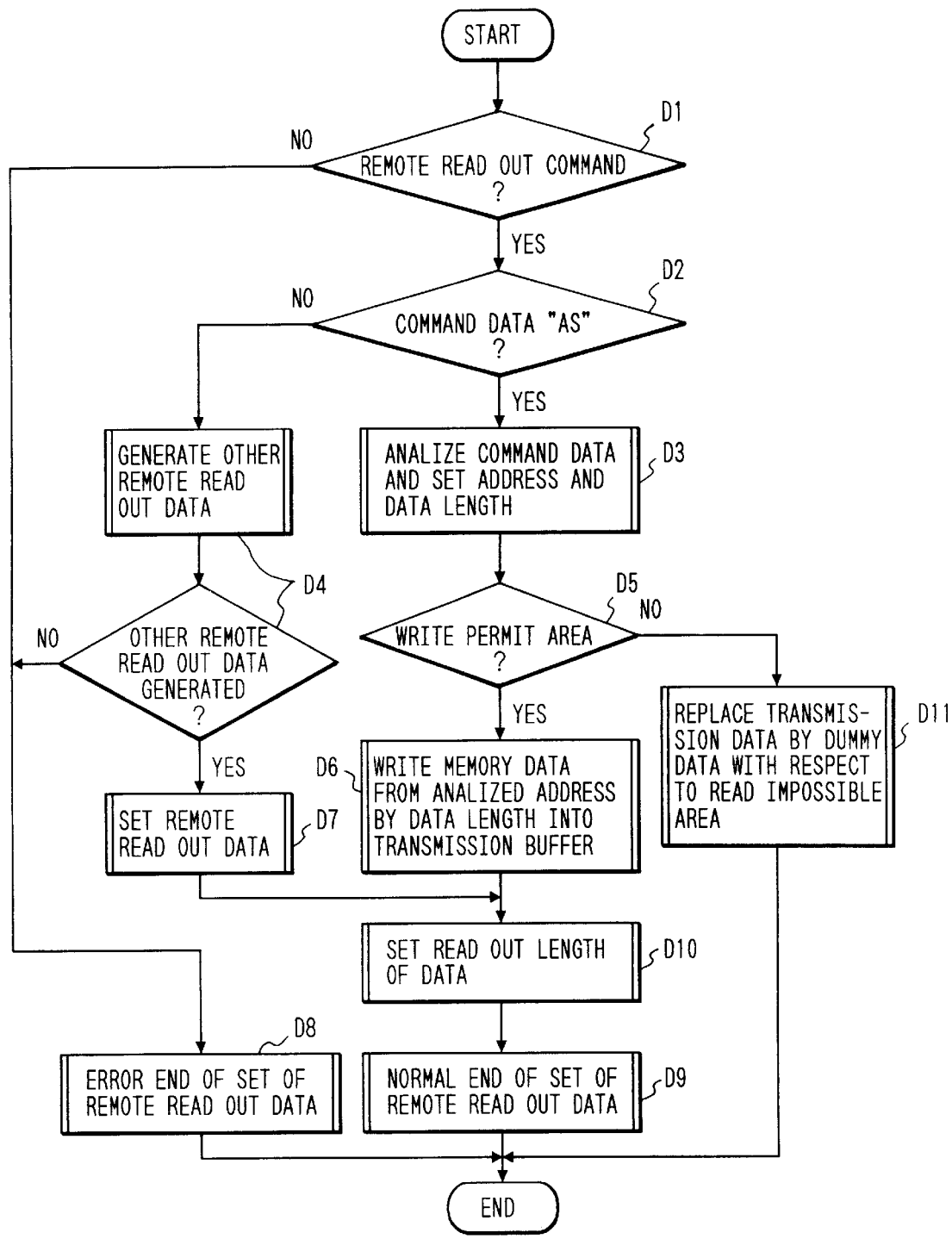
FIG. 11 is a flowchart 2 of a formation of a reading-out data of memory data (embodiment 2)

In the second embodiment, referring to a flowchart of FIG. 11 in place of the flowchart of FIG. 7 of the generation method of the read data, binary data in the remote registry system is read out and generated.

In the flowchart of FIG. 11, processing steps D1 to D10 are substantially the same as steps C1 to C10 in FIG. 7 of the first embodiment.

D11. With respect to data in the area from which the data cannot be read out, it is replaced to dummy data (00H) and the read data is stored and step D9 follows.

The procedure when the data is read out has been mentioned as above. The second embodiment is characterized by comprising analyzing means for judging that the area is an area from which data cannot be read out and replacing means for replacing the data in the area from which data cannot be read out to the dummy data. The address or the data contents to inhibit the reading operation can be set by the operation panel 5.

(Third embodiment)

A facsimile apparatus of the third embodiment is similar to that of the first embodiment as shown in FIG. 1. The RAM 8 is used for the buffer 11 for reception data (first memory means) of the remote registry system, the registry switch 10, the confidential data area 9 having a user's password, communication management data, etc. therein, and the like.

A construction and a data flow of the remote registry system in the embodiment are similar to those in the embodiment 1.

A machine type declaration phase (FIG. 4) of the RMD communication procedure is also similar to that of the embodiment 1.

FIG. 5 shows the data registry/demand phase in the RMD communication procedure in the embodiment. Each of signals TRAINING, TCF, and DATA is a high speed signal (9600 bps, 7200 bps, or the like) and is different from another facsimile procedure signal (300 bps) (the background is shown by gray color).

E5. The data transfer demand command NSF is transmitted from the terminal.

E6. When the data of the transmission file is the registry/demand command data, the center sends the signals NSS, DCS, TRAINING, and TCF and executes a training.

E7. When the terminal fails in training, FTT is transmitted, thereby restarting the training by re-training.

E8. When the training is OK, CFR is transmitted and the processing routine advances to the reception of the registry data.

E9. When CFR is received, the center transmits the registry data by TRAINING, DATA, and PPS-Q.

E10. When the frame of the received data is correctly received, the terminal sends RNR and advances to the flow control of the registry waiting. (In this instance, an RMD registry task is activated.)

E11. When there is an error in the frame of the data received by the terminal, PPR is transmitted and retransmission of the error frame is demanded. When the number of transmission times of PPR is less than four times, the retransmitting data TRAINING, DATA, and PPS-Q are sent with respect to the error frame. When the number of transmission times of PPR is equal to four, CTC is sent. When CTR is received, the communication speed is reduced and the retransmitting data is transmitted. When the communication speed is reduced to the lowest speed of 300 bps and the transmission of PPR is the fourth time, DCN is transmitted from the center and the communication is finished.

E12. When RNR is received, the center sends RR and advances to the registry waiting phase.

E13. When the RMD registry task of the terminal is normally finished, MCF is transmitted as a response after the data registry.

E14. When the RMD registry task of the terminal is abnormally finished, RTN is transmitted as a response after the data registry.

E15. When the response after the data registry is MCF, the center regards that the RMD communication is normally finished, preserves the communication status, and transmits DCN, thereby normally finishing the RMD communication. When the response after the data registry is RTN, the center regards that the RMD communication was finished abnormally, preserves the communication status, and transmits DCN, thereby finishing the RMD communication.

E16. When DCN is received, the terminal similarly sends DCN and finishes the RMD communication.

The data to be transmitted in step E9 is as shown in FIG. 8A.

Figure 12:
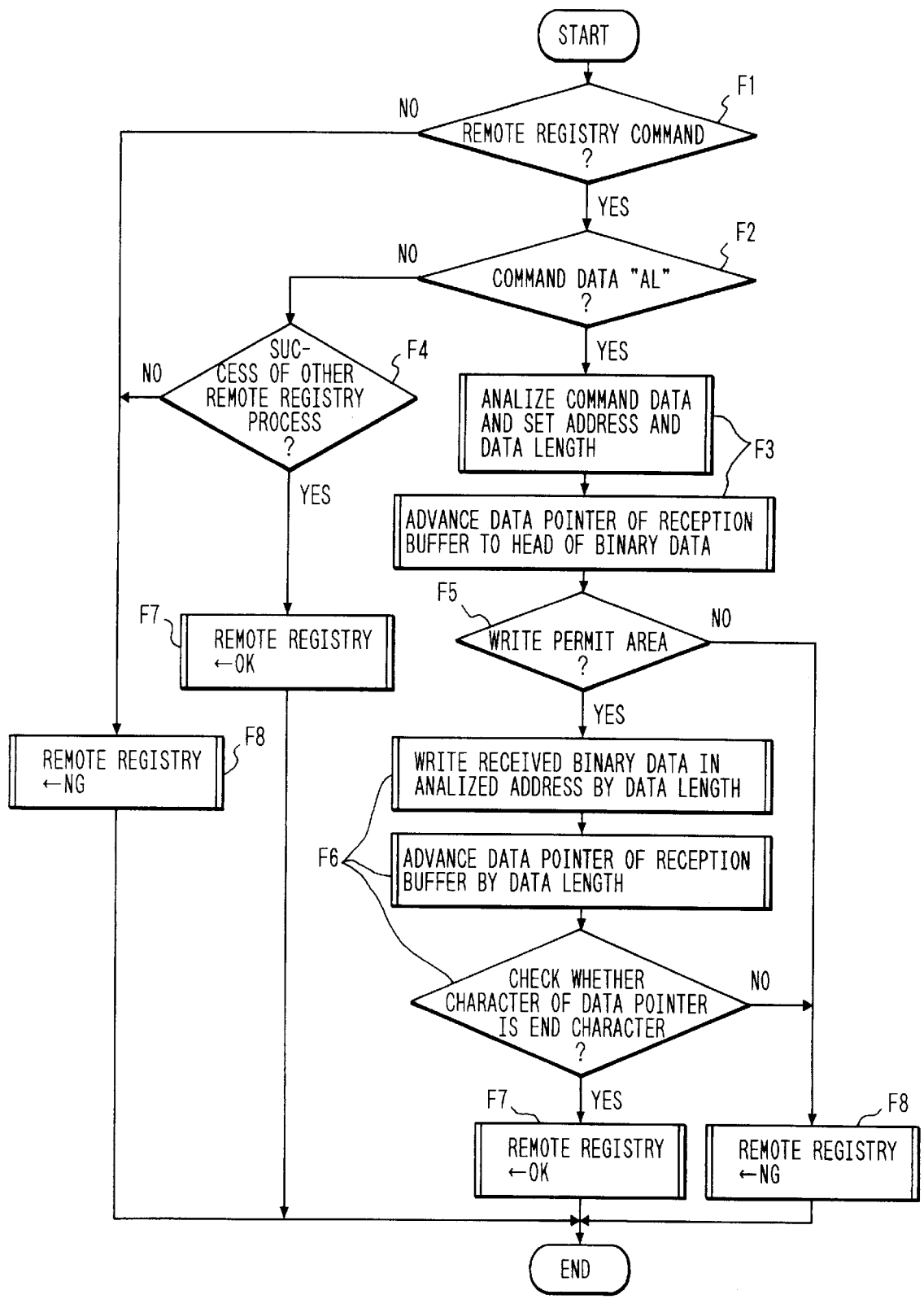
FIG. 12 is a flowchart 1 for writing binary data into a memory (embodiment 3)

The writing operation of the binary data to the memory in the embodiment is executed as an RMD registry task at the time of the flow control in step E10 in the above-mentioned RMD communication procedure. The write flow of the binary data to the memory is shown in FIG. 12.

F1. A check is made to see whether the command is the remote registry command or not. If YES, step F2 follows. If NO, step F8 follows.

F2. A check is made to see whether the command is the AL command or not. If YES, step F3 follows. If NO, step F4 follows.

F3. The data of the AL command is analyzed by the analyzing means. The start address and the data length are set and a data pointer of the reception buffer is moved to the head of the binary data. The processing routine advances to step F5.

F4. Another remote registry process is executed. When the registry process is normally finished, step F7 follows. When the registry process is finished as an error, step F8 follows.

F5. A check is made to see whether the area is the write permit area or not. If YES, step F6 follows. If NO, step F8 follows.

F6. The memory data (binary data) of an amount corresponding to the data length from the start address is written from the reception buffer into the memory. The data pointer of the reception buffer is moved by the data length. When the character of the data pointer is the end character CR (0DH), the processing routine advances to step F7. When the character of the data pointer is not the end character, step F8 follows.

F7. The registry is normally finished.

F8. As a failure in the data registry, the remote registry error is notified to the host side and the operation is finished.

The procedure of the data writing has been mentioned above. The embodiment is characterized by having the analyzing means for judging by the memory address map in FIG. 10 in the check of the write area in the procedure of step F5 with respect to an ROM area (area which is reset by the facsimile apparatus when the writing operation to the area is executed), an address area (area in which data cannot be written) out of the memory address range, a work area (area which is locked by the facsimile apparatus when data is written in the memory) of the OS, and the like, thereby preventing an erroneous operation due to the writing of the binary data. The address or the data contents to inhibit the writing operation can be set by the operation panel 5.

(Fourth embodiment)

Figure 13:
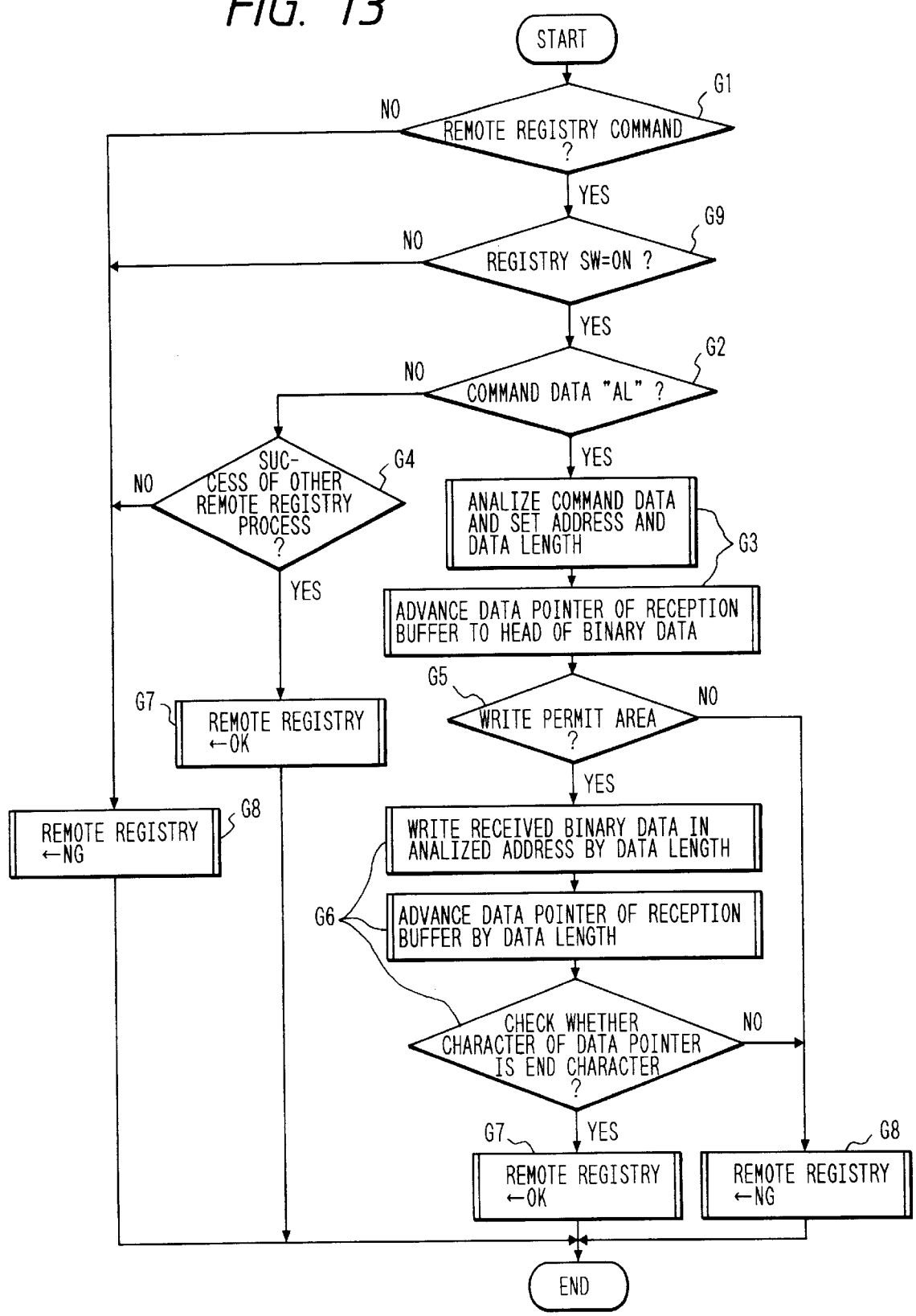
FIG. 13 is a flowchart 2 for writing binary data into a memory (embodiment 4).

The fourth embodiment has a construction similar to that of the third embodiment. As shown in FIG. 13 in place of FIG. 12, a flow for writing the binary data to the memory is such that when the registry switch of the facsimile apparatus is turned off and the apparatus is in a state of write inhibition, the writing of data to the memory is inhibited as an area in which data cannot be written. When the registry switch of the facsimile apparatus is turned on, the processing routine advances to step G2 and subsequent steps corresponding to step F2 and subsequent steps in the flow of FIG. 12. The address and the data contents to inhibit the writing operation can be set by the operation panel 5.

As mentioned above, by checking the read-out area and inhibiting the reading operation of data in a predetermined area when the data is read out, the confidential information of the user cannot be read out, thereby enabling a security to be raised.

The write area is checked and the data writing to a predetermined area is inhibited when the data is written, thereby preventing the erroneous operation of the facsimile apparatus. For instance, when writing the memory data, by writing the data into the address of the writing area of the ROM or the like, the resetting operation of the facsimile apparatus can be prevented.

The area in which the reading operation is inhibited and the area in which the writing operation is inhibited can be set to the same or different areas.

Any one of a construction in which the data writing and reading operations to/from the set area are inhibited or a construction in which the data writing and reading operations to/from areas other than the set area are inhibited can be used.

Although the foregoing embodiments have been mentioned with respect to the facsimile apparatus, the invention can be also applied to a copying apparatus.

Although the invention has been described above on the basis of the preferred embodiments, the present invention is not limited to the foregoing embodiments but many modifications and variations are possible within the spirit and scope of the appended claims of the invention.

What is claimed is:

1. A data communication system comprising:

a computer; and an image forming apparatus including:
  image forming means for forming an image on a sheet;
  memory means for storing data, said memory means having a memory area including a program area in which a program for controlling said image forming means is stored,
  communication means for communicating data with said computer,
  control means for controlling said image forming apparatus to have said computer make access to said memory means through said communication means, and
  setting means for arbitrarily setting an address as a set address in said memory area, access by said computer to the set address being inhibited,
  wherein said control means controls said memory means in accordance with the set address to enable or inhibit access by said computer to said memory means,
  wherein said access is an operation in which said computer reads data in said memory means, and
  wherein, when reading at the set address is designated, said control means outputs dummy data to said computer through said communication means.

2. A system according to claim 1, wherein said image forming apparatus has a facsimile function and said data is at least one of at least communication management data and abbreviated dial data.

3. A system according to claim 2, wherein said memory area of said memory means includes an image memory area used in said facsimile function.

4. A system according to claim 1, wherein addresses in said memory means include an address in which a reading operation is permitted and an address in which a reading operation is inhibited.

5. A system according to claim 1, wherein said computer sends an access command and a designated address in combined form to said image forming apparatus.

6. An image forming apparatus comprising:
  image forming means for forming an image on a sheet;
  memory means for storing data, said memory means having a memory area including a program area in which a program for controlling said image forming means is stored;
  communication means for communicating data with an external computer;
  control means for controlling said image forming apparatus to have the computer make access to said memory means through said communication means; and
  setting means for arbitrarily setting an address as a set address in said memory area, access by the computer to the set address being inhibited,
  wherein said control means controls said memory means in accordance with the address set by said setting means to enable or inhibit access by the computer to said memory means,
  wherein said access is an operation in which the computer reads data in said memory means, and
  wherein, when reading of the set address is designated, said control means outputs dummy data to the computer through said communication means.

7. An apparatus according to claim 6, wherein said image forming apparatus has a facsimile function and said data is at least one of at least communication management data and abbreviated dial data.

8. An apparatus according to claim 7, wherein the memory area of said memory means includes an image memory area used in said facsimile function.

9. An apparatus according to claim 6, wherein said control means judges whether an address designated by the computer is the set address or not, and notifies an error to the computer when the designated address is the set address.

10. An apparatus according to claim 6, wherein addresses in said memory means include an address in which a reading operation is permitted and an address in which a reading operation is inhibited.

11. An apparatus according to claim 6, wherein said control means judges whether an address designated by the computer is the set address or not, and transmits predetermined data different from data in the set address to the computer through said communication means when the designated address is the set predetermined address.

12. An apparatus according to claim 6, wherein the set address is an address such that when data is written to the set address, said image forming apparatus is reset or locked.

13. An apparatus according to claim 6, wherein addresses in said memory means include an address in which a writing operation is permitted and an address in which a writing operation is inhibited.

14. An apparatus according to claim 6, wherein the computer sends an access command and a designated address in combined form to said image forming apparatus.

15. A data access method at an image forming apparatus, comprising the steps of:
  forming an image on a sheet;
  storing data in memory means, the memory means having a memory area including a program area in which a program for controlling said image forming step is stored;
  communicating data with an external computer using communication means;
  controlling the image forming apparatus to have the computer make access to the memory means through the communication means; and arbitrarily setting an address as a set address in the memory area, access by the computer to the set address being inhibited, wherein said control step controls the memory means in accordance with the address set by said setting step to enable or inhibit access by the computer to the memory means, wherein said access is an operation in which the computer reads data in the memory means, and wherein, when reading of the set address is designated, said control step outputs dummy data to the computer through the communication means.

16. A method according to claim 15, wherein the image forming apparatus has a facsimile function and said data is at least one of at least communication management data and abbreviated dial data.

17. A method according to claim 16, wherein the memory area of the memory means includes an image memory area used in said facsimile function.

18. A method according to claim 15, wherein the computer sends an access command and a designated address in combined form to the image forming apparatus.

* * * * *

UNITED STATES PATENT AND TRADEMARK OFFICE
CERTIFICATE OF CORRECTION

PATENT NO. : 5,822,085

DATED : October 13, 1998

INVENTOR(S) : KAZUHIRO SUGAWARA ET AL.

Page 1 of 2

It is certified that error appears in the above-identified patent and that said Letters Patent is hereby corrected as shown below:

REFERENCES CITED [56]

FOREIGN PATENT DOCUMENTS, "6267191" should read --6-27191--.

SHEET 7

Fig. 7, "ANALIZE" should read --ANALYZE--; and "ANALIZED" should read --ANALYZED--.

SHEET 11

Fig. 11, "ANALIZE" should read --ANALYZE--; and "ANALIZED" should read --ANALYZED--.

SHEET 12

Fig. 12, "ANALIZE" should read --ANALYZE--; and "ANALIZED" should read --ANALYZED--.

SHEET 13

Fig. 13, "ANALIZE" should read --ANALYZE--; and "ANALIZED" should read --ANALYZED--.

UNITED STATES PATENT AND TRADEMARK OFFICE
CERTIFICATE OF CORRECTION

PATENT NO. : 5,822,085
DATED : October 13, 1998
INVENTOR(S) : KAZUHIRO SUGAWARA ET AL.   Page 2 of 2

It is certified that error appears in the above-identified patent and that said Letters Patent is hereby corrected as shown below:

COLUMN 1

Line 20, "to" should read --with--.
    Line 24, "was" should read --is--.
    Line 43, "Further another" should read --Yet another--.

COLUMN 2

Line 27, "in an" should read --in a--.
    Line 28, "an ROM" should read --a ROM--.

COLUMN 10

Line 55, "at" should read --for use in--.

Signed and Sealed this

Tenth Day of August, 1999

Attest:

Q. TODD DICKINSON

Attesting Officer    Acting Commissioner of Patents and Trademarks